(12) United States Patent
Lo et al.

(10) Patent No.: US 7,955,953 B2
(45) Date of Patent: Jun. 7, 2011

(54) METHOD OF FORMING STACKED DIE PACKAGE

(75) Inventors: Wai Yew Lo, Petaling Jaya (MY); Heng Keong Yip, Darul Ehsan (MY)

(73) Assignee: Freescale Semiconductor, Inc., Austin, TX (US)

( * ) Notice: Subject to any disclaimer, the term of this patent is extended or adjusted under 35 U.S.C. 154(b) by 763 days.

(21) Appl. No.: 11/957,486

(22) Filed: Dec. 17, 2007

(65) Prior Publication Data

US 2009/0152717 A1 Jun. 18, 2009

(51) Int. Cl.
*H01L 21/00* (2006.01)
*H01L 23/495* (2006.01)

(52) U.S. Cl. ......... 438/464; 438/108; 438/109; 257/668

(58) Field of Classification Search .................. 438/108, 438/109, 464; 257/668
See application file for complete search history.

(56) References Cited

U.S. PATENT DOCUMENTS

| 5,200,362 | A | | 4/1993 | Lin et al. | |
|---|---|---|---|---|---|
| 5,900,676 | A | * | 5/1999 | Kweon et al. | 257/787 |
| 6,287,893 | B1 | | 9/2001 | Elenius et al. | |
| 6,700,188 | B2 | * | 3/2004 | Lin | 257/684 |
| 6,794,273 | B2 | * | 9/2004 | Saito et al. | 438/462 |
| 6,921,968 | B2 | | 7/2005 | Chung | |
| 7,109,059 | B2 | | 9/2006 | Wark | |
| 7,208,335 | B2 | * | 4/2007 | Boon et al. | 438/33 |
| 7,253,503 | B1 | * | 8/2007 | Fusaro et al. | 257/668 |
| 7,445,959 | B2 | * | 11/2008 | Theuss | 438/108 |
| 7,846,775 | B1 | * | 12/2010 | Lee et al. | 438/112 |
| 2006/0091561 | A1 | * | 5/2006 | Dangelmaier et al. | 257/778 |
| 2006/0246624 | A1 | * | 11/2006 | Fuergut et al. | 438/109 |
| 2008/0029865 | A1 | * | 2/2008 | Bauer et al. | 257/684 |
| 2009/0001603 | A1 | * | 1/2009 | Chang et al. | 257/778 |
| 2009/0315190 | A1 | * | 12/2009 | Kikuchi et al. | 257/778 |

* cited by examiner

*Primary Examiner* — Matthew C Landau
*Assistant Examiner* — James M Mitchell
(74) *Attorney, Agent, or Firm* — Charles Bergere

(57) ABSTRACT

A method of packaging semiconductor integrated circuits, including the steps of providing a transfer film and forming a patterned, conductive layer on a surface of the transfer film. A first semiconductor integrated circuit (IC) then is attached to the transfer film, where an active side of the first IC is attached to the transfer film. A second semiconductor IC then is attached to the first IC, where a bottom side of the second IC is attached to a bottom side of the first IC. Die pads on an active surface of the second IC are electrically connected to the conductive layer with wires and then a resin material is provided on one side of the transfer film to encapsulate the first and second ICs, the wires and a portion of the conductive layer. Next the transfer film is removed, which exposes the active side of the first IC and the conductive layer. An electrical distribution layer is formed over the active side of the first IC and the conductive layer and conductive balls are attached to the electrical distribution layer. The conductive balls allow electrical interconnection to the first and second integrated circuits.

16 Claims, 2 Drawing Sheets

METHOD OF FORMING STACKED DIE PACKAGE

BACKGROUND OF THE INVENTION

The present invention relates to the packaging of integrated circuits (ICs) and more particularly to a method of forming a stacked die package.

There is a continuing demand for speed and miniaturization in the electronics industry that drives assembly and packaging technology. Thus, packaging technology has turned to 3-D packages. 3-D packaging technologies include stacked die, stacked packages, folded package assemblies, and combinations of these options. Stacked die allows suppliers to rapidly develop basic multiple-die combinations. Often, two or more die are encased in a single fine-pitch ball grid array (BGA) package outline. Stacked packages offer a high-density packaging scheme that helps reduce package footprint. Unfortunately, such stacked die packages are relatively thick.

Another way to reduce package size is to modify the way in which integrated circuits are connected to each other. One method, called redistributed chip package (RCP) is to use photolithography and copper-plating steps to create chip-to-chip interconnects. The RCP approach begins by separating each die within an IC and placing the individual die in wafer-sized panel. Epoxy and molding compound are applied to the die, connection patterns are lithographically defined, vias are etched through a dielectric to the chip's I/O pads and copper interconnects are electroplated. RCP techniques can be used to define either land grid arrays or C5 balls to link the die to a substrate of a larger system, for example, a cell phone.

It would be advantageous to be able to provide a thin, stacked die package in order to further shrink the size of electronic devices.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
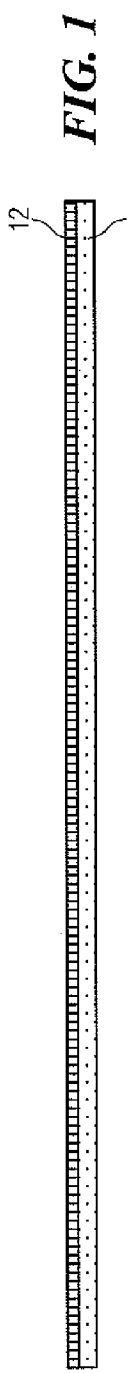
FIG. 1 is an enlarged cross-sectional view of a tape and a film layer disposed on the tape in accordance with an embodiment of the present invention.

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

In one embodiment, the present invention provides a method of packaging semiconductor integrated circuits, including the steps of providing a transfer film and forming a patterned, conductive layer on a surface of the transfer film. A first semiconductor integrated circuit (IC) then is attached to the transfer film, where an active side of the first IC is attached to the transfer film. A second semiconductor IC then is attached to the first IC, where a bottom side of the second IC is attached to a bottom side of the first IC. Die pads on an active surface of the second IC are electrically connected to the conductive layer with wires and then a resin material is provided on one side of the transfer film to encapsulate the first and second ICs, the wires and a portion of the conductive layer. Next the transfer film is removed, which exposes the active side of the first IC and the conductive layer. An electrical distribution layer is formed over the active side of the first IC and the conductive layer and conductive balls are attached to the electrical distribution layer. The conductive balls allow electrical interconnection to the first and second integrated circuits.

A method of packaging semiconductor integrated circuits will now be described with reference to FIGS. 1-12.

FIG. 1 shows a transfer film 10, which in one embodiment is a strip of tape, such as a polyimide tape. Preferably, the transfer film 10 has an adhesive on one or both of its sides. The transfer film 10 serves as a base upon which an electronic device will be assembled, first by forming a patterned, conductive layer on a surface of the transfer film 10.

Figure 2:
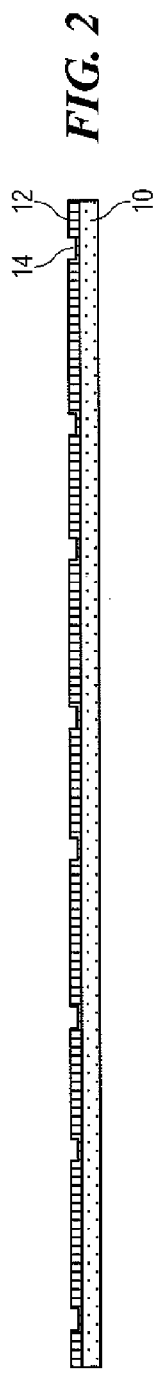
FIG. 2 is an enlarged cross-sectional view of the tape and film layer thereon after an etching step.
Figure 3:
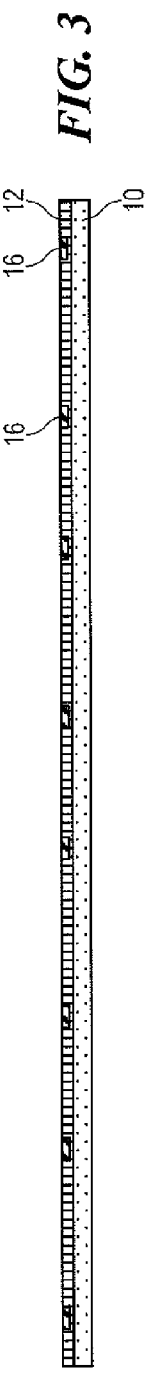
FIG. 3 is an enlarged cross-sectional view of the tape, etched film, and a conductive layer.
Figure 4:
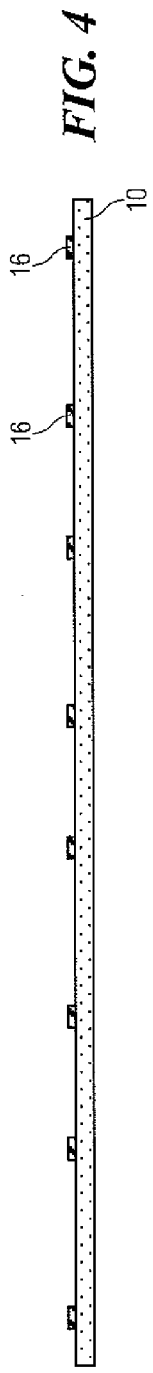
FIG. 4 is an enlarged cross-sectional view of the tape and conductive layer after the etched film has been stripped from the tape.

In one embodiment, the patterned conductive layer is formed with a photolithography process and a plating process. First, a photoresistive coating is disposed on a first surface of the transfer film. In the embodiment shown, the photoresistive coating is a dry film 12 that is laminated onto the first surface of the transfer film 10. Referring to FIG. 2, the dry film 12 is exposed and developed to form a predetermined pattern 14 in the dry film 12. Next, as shown in FIG. 3, a conductive metal 16 is deposited over the developed film 12 and into the pattern 14. In one embodiment, the conductive metal 16 is seed copper that is deposed onto the film 12 and pattern 14 by sputtering. For example, 1-2 Angstrom's of seed copper are sputtered onto the dry film 12 and pattern 14 and then electroplated with Nickel or Gold or a Ni/Au alloy. Then, as shown in FIG. 4, the dry film 12 is removed, such as by stripping, leaving the transfer film 10 and a patterned conductive layer 16 on the first surface of the transfer film 10. Such stripping processes are known by those of skill in the art so further description is not required for a complete understanding of the invention.

Figure 5:
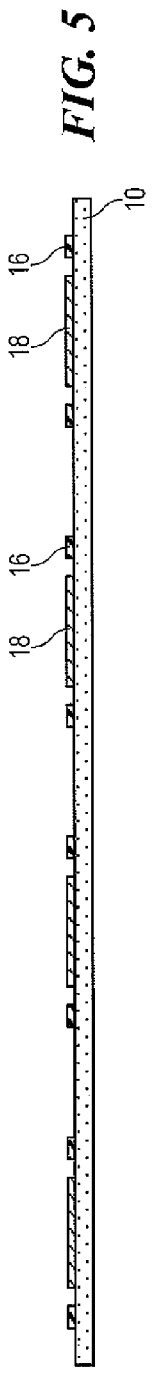
FIG. 5 is an enlarged cross-sectional view illustrating a first integrated circuit attached to the film.
Figure 6:
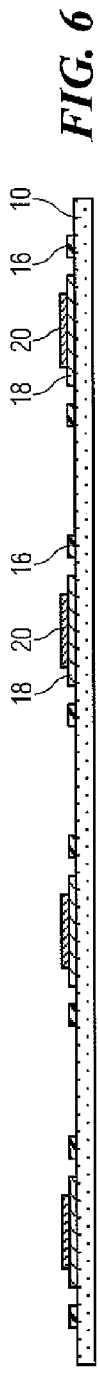
FIG. 6 is an enlarged cross-sectional view illustrating a second integrated circuit attached to the first integrated circuit.

Referring to FIG. 5, a first semiconductor integrated circuit (IC) 18 is attached to the transfer film 10 at a predetermined position. As shown in the drawings, multiple electronic devices are assembled simultaneously, so multiple first ICs 18 are attached to the transfer film 10 at predetermined positions. The positions correspond with the conductive pattern formed on the transfer film 10. The first IC 18 is bonded to the transfer film 10 with an active side of the IC 18 facing the transfer film 10. In the presently preferred embodiment, the transfer film 10 has an adhesive on its first side, so the first IC 18 is attached to the transfer film 10 with the adhesive. The active side of the IC 18 is a side that has a plurality of die bonding pads thereon.

A second semiconductor IC 20 is attached to the first IC 18. In this embodiment, a bottom side of the second IC 20 is attached to a bottom side of the first IC 18. Thus, the active side of the second IC 20, that is, the side with the die pads, is exposed. The second IC 20 may be attached to the first IC 18 using currently known die attach processes, like epoxy or tape. In the embodiment shown, the second IC 20 is smaller than the first IC 18. However, the second IC 20 could be the same size or larger than the first IC 18.

The first and second ICs 18, 20 may be processors, such as a digital signal processor (DSP), a special function circuit, such as a memory address generator, or a circuit that performs any other type of function. The first and second ICs 18 and 20 are not limited to a particular technology such as CMOS, or derived from any particular wafer technology. Further, the present invention can accommodate devices of various sizes, as will be understood by those of skill in the art. A typical example of first and second ICs 18 and 20 are a DSP and a memory device. The first and second ICs 18, 20 are formed in a known manner using conventional semiconductor device fabrication processes. Accordingly, further description of the manufacture of the first and second ICs 18, 20 is not required for a complete understanding of the present invention.

Figure 7:
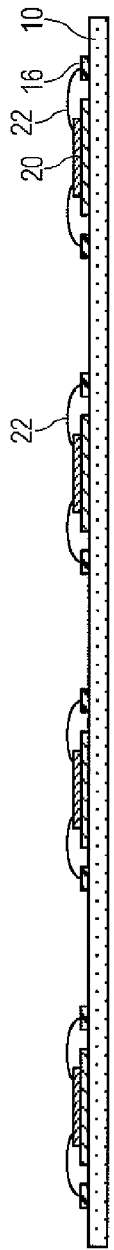
FIG. 7 is an enlarged cross-sectional view illustrating a wire bonding step for electrically connecting the second integrated circuit to the conductive layer.
Figure 8:
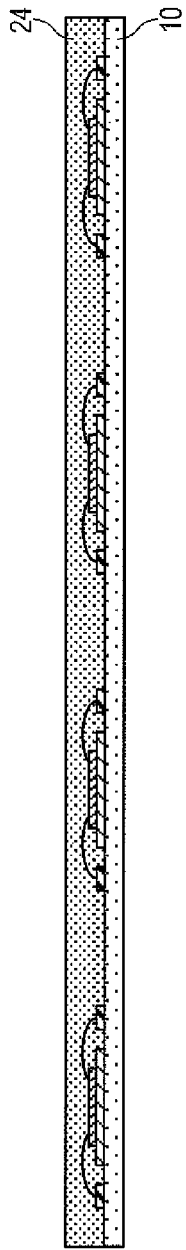
FIG. 8 is an enlarged cross-sectional view illustrating an encapsulation step.

Referring to FIG. 7, die pads on the active side of the second IC 20 are electrically connected to the conductive layer 16 with wires 22 using a conventional wire bonding process. FIG. 8 shows a resin material 24 provided on one side of the transfer film 10 that covers the first and second ICs 18, 20, the wires 22 and the conductive layer 16. The resin material 24 may be formed over the transfer film 10, conductive layer 16, first and second ICs 18, 20, and wires 22 with a conventional molding process.

Figure 9:
FIG. 9 is an enlarged cross-sectional view illustrating the removal of the tape.
Figure 10:
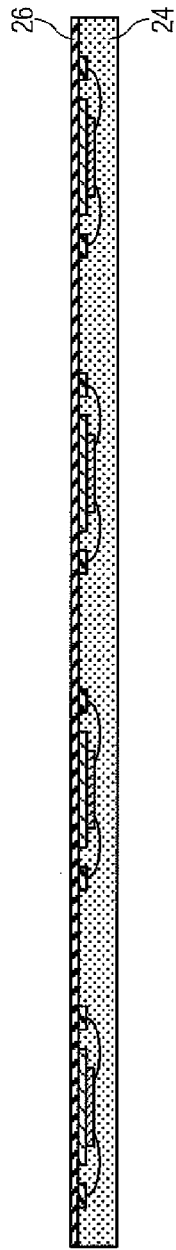
FIG. 10 is an enlarged cross-sectional view illustrating the formation of a redistribution layer.
Figure 11:
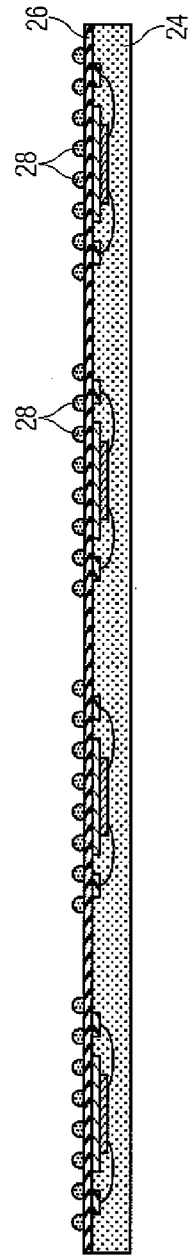
FIG. 11 is an enlarged cross-sectional view illustrating a conductive ball attachment step.

As shown in FIG. 9, the transfer film 10 then is removed to expose the active side of the first IC 18 and the conductive layer 16. The transfer film 10 may be removed using a conventional tape stripping process. As shown in FIG. 10, once the transfer film 10 is removed, the workpiece (conductive layer 16, first and second ICs 18, 20, wires 22 and mold 24) is flipped over and an electrical distribution layer 26 is formed thereon. The electrical distribution layer 26 is formed using known photolithography and plating processes. In one embodiment, the distribution layer 26 is formed using a redistributed chip packaging (RCP) process. FIG. 11 shows conductive balls 28 attached to the electrical distribution layer 26. The conductive balls 28 allow electrical interconnection to the first and second integrated circuits 18, 20. In one embodiment, the conductive balls 28 comprise C4 solder balls.

Figure 12:
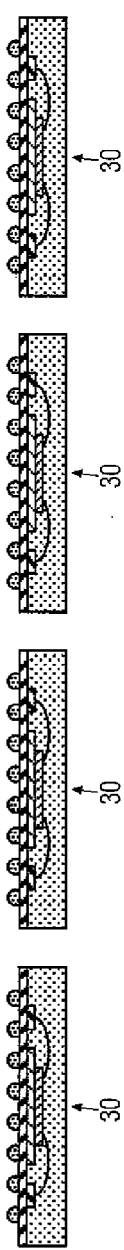
FIG. 12 is an enlarged cross-sectional view illustrating a singulation step.

Finally, as shown in FIG. 12, a singulation process is performed on the workpiece, providing individual, packaged semiconductor devices 30. Singulation may be via mechanical saw or laser, or similar processes.

As is evident from the foregoing discussion, the present invention provides a thin, stacked die package and a method of assembling such a stacked die package. The present invention allows for a low-profile stacked die package.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A method of packaging semiconductor integrated circuits, comprising the steps of:
   providing a transfer film;
   forming a patterned, conductive layer on a surface of the transfer film via a photolithography process;
   attaching a first semiconductor integrated circuit (IC) to the transfer film, wherein an active side of the first IC is attached to the transfer film;
   attaching a second semiconductor IC to the first IC, wherein a bottom side of the second IC is attached to a bottom side of the first IC;
   electrically connecting die pads on an active surface of the second IC to the conductive layer with wires;
   providing a resin material on one side of the transfer film to encapsulate the first and second ICs, the wires and a portion of the conductive layer;
   removing the transfer film, thereby exposing the active side of the first IC and the conductive layer;
   forming an electrical distribution layer over the active side of the first IC and the conductive layer; and
   attaching conductive balls to the electrical distribution layer, wherein the conductive balls allow electrical interconnection to the first and second integrated circuits.

2. The method of packaging semiconductor integrated circuits of claim 1, wherein the transfer film comprises a polyimide tape.

3. The method of packaging semiconductor integrated circuits of claim 1, wherein the conductive layer comprises copper.

4. The method of packaging semiconductor integrated circuits of claim 1, wherein the transfer film has an adhesive thereon and the first IC is attached to the transfer film with the adhesive.

5. The method of packaging semiconductor integrated circuits of claim 1, wherein the step of attaching the first IC to the second IC includes attaching with one of an epoxy and an adhesive tape.

6. A method of packaging a semiconductor integrated circuit of claim 1, wherein the step of forming a patterned, conductive layer on a surface of the transfer film comprises:
   forming a dry film layer on a surface of the transfer film;
   forming a pattern in the dry film layer;
   depositing a conductive metal layer in the patterned dry film layer; and
   stripping the dry film layer.

7. The method of packaging a semiconductor integrated circuit of claim 1, wherein the step of forming an electrical distribution layer over the active side of the first IC and the conductive layer includes a photolithography process.

8. The method of packaging a semiconductor integrated circuit of claim 7, wherein the step of forming an electrical distribution layer over the active side of the first IC and the conductive layer further includes a plating process.

9. A method of packaging semiconductor integrated circuits, comprising the steps of:

providing a transfer film;

forming a dry film layer on a surface of the transfer film;

forming a pattern in the dry film layer;

depositing a conductive metal layer in the patterned dry film layer;

stripping the dry film layer, thereby leaving a patterned conductive layer on a surface of the transfer film attaching a first semiconductor integrated circuit (IC) to the transfer film, wherein an active side of the first IC is attached to the transfer film;

attaching a second semiconductor IC to the first IC, wherein a bottom side of the second IC is attached to a bottom side of the first IC;

electrically connecting die pads on an active surface of the second IC to the conductive layer with wires;

providing a resin material on one side of the transfer film to encapsulate the first and second ICs, the wires and a portion of the conductive layer;

removing the transfer film, thereby exposing the active side of the first IC and the conductive layer;

forming an electrical distribution layer over the active side of the first IC and the conductive layer; and attaching conductive balls to the electrical distribution layer, wherein the conductive balls allow electrical interconnection to the first and second integrated circuits.

10. The method of packaging semiconductor integrated circuits of claim 9, wherein the transfer film comprises a polyimide tape.

11. The method of packaging semiconductor integrated circuits of claim 9, wherein the step of forming a pattern in the dry film layer comprises a photolithography process.

12. The method of packaging semiconductor integrated circuits of claim 9, wherein the conductive metal comprises copper.

13. The method of packaging semiconductor integrated circuits of claim 9, wherein the transfer film has an adhesive thereon and the first IC is attached to the transfer film with the adhesive.

14. The method of packaging semiconductor integrated circuits of claim 9, wherein the step of attaching the first IC to the second IC includes attaching with one of an epoxy and an adhesive tape.

15. The method of packaging a semiconductor integrated circuit of claim 9, wherein the step of forming an electrical distribution layer over the active side of the first IC and the conductive layer includes a photolithography process and a plating process.

16. A semiconductor device formed according to the method of claim 9.

\* \* \* \* \*